US006949984B2

(12) United States Patent
Siniscalchi

(10) Patent No.: US 6,949,984 B2
(45) Date of Patent: Sep. 27, 2005

(54) VOLTAGE CONTROLLED OSCILLATOR HAVING CONTROL CURRENT COMPENSATION

(75) Inventor: Patrick Peter Siniscalchi, Sachse, TX (US)

(73) Assignee: Texas Instruments Incorporated, Dallas, TX (US)

( * ) Notice: Subject to any disclaimer, the term of this patent is extended or adjusted under 35 U.S.C. 154(b) by 232 days.

(21) Appl. No.: 10/164,469

(22) Filed: Jun. 6, 2002

(65) Prior Publication Data

US 2003/0227337 A1 Dec. 11, 2003

(51) Int. Cl.[7] ............................................... H03L 1/00
(52) U.S. Cl. ....................................... 331/176; 363/73
(58) Field of Search ............................ 331/100, 108 R, 331/175, 176, 177 R, 108 A; 363/73

(56) References Cited

U.S. PATENT DOCUMENTS

| | | | | | |
|---|---|---|---|---|---|
| 5,061,907 | A | * | 10/1991 | Rasmussen | 331/57 |
| 5,426,398 | A | * | 6/1995 | Kuo | 331/57 |
| 5,994,939 | A | * | 11/1999 | Johnson et al. | 327/280 |
| 6,002,280 | A | * | 12/1999 | Robbins et al. | 327/156 |
| 6,016,332 | A | * | 1/2000 | Smith et al. | 375/376 |
| 6,058,033 | A | * | 5/2000 | Williams et al. | 363/73 |
| 6,184,723 | B1 | * | 2/2001 | Frechette et al. | 327/68 |
| 6,404,294 | B1 | * | 6/2002 | Sha et al. | 331/57 |
| 6,462,623 | B1 | * | 10/2002 | Horan et al. | 331/17 |
| 6,466,100 | B2 | * | 10/2002 | Mullgrav et al. | 331/179 |

OTHER PUBLICATIONS

Banu, Mihai, "Mos Oscillators with Multi–Decade Tuning Range and Gigahertz Maximum Speed," IEEE Journal of Solid–State Circuits, vol. 23, No. 6, Dec. 1988, pp. 1386–1393.

* cited by examiner

Primary Examiner—Timothy P. Callahan
Assistant Examiner—Cassandra Cox
(74) Attorney, Agent, or Firm—Wade James Brady III; Frederick J. Telecky, Jr.

(57) ABSTRACT

A voltage controlled oscillator (600) includes a voltage to current portion (400) that is inversely proportional to the semiconductor processing in order to compensate for variations both in the low-frequency and high-frequency portions of the VCO gain response. To compensate for low-frequency variations, a portion of the control current ($I_{CTL}$), non-compensated control current $I_{CTLNC}$ (436), is subtracted from a reference current $I_{REF}$ (408) and the result, a low-frequency compensating control current, $I_{CTLLF}$ (438), is added to the non-compensated control current $I_{CTLNC}$ (436). To compensate for high frequency variations, a number of differential transistor pairs (410–416) are provided that have tail currents that are inversely proportional to the processing. One input (426) to all the differential pairs is connected to the VCO's control voltage while the other inputs (418–424) are connected to successively increasing voltages in the control voltage range. One output, $I_{CTLHF}$ (440), of all the differential pairs is summed with the non-compensated control current $I_{CTLNC}$ (436) while the other output of each differential pair is connected to the power supply. By adjusting the amount of non-compensated control current $I_{CTLNC}$ (436) provided to transistor M1 using the low frequency gain compensation circuit 402 and high frequency gain compensation circuit 404, VCO (400) provides for a process-insensitive, substantially constant gain VCO.

20 Claims, 3 Drawing Sheets

VOLTAGE CONTROLLED OSCILLATOR HAVING CONTROL CURRENT COMPENSATION

TECHNICAL FIELD

This invention relates in general to the field of electronic circuits, and in particular to a Voltage Controlled Oscillator (VCO).

BACKGROUND

Voltage Controlled Oscillators (VCOs) are key components used in Phase-Locked Loops (PLLs). The gain of a VCO, it's change in frequency for a change in control voltage, is a factor in the PLL's open loop gain, and therefore can have an effect on the PLL's overall stability. In FIG. 1 there is shown a block diagram of a prior art PLL, with its open loop gain determined by the following formula:

$$\text{Open loop gain} = \frac{K_{pd} * K_{cp} * K_{LF} * K_{VCO}}{M}$$

Due to variations in integrated circuit processing, the gain of a VCO can vary greatly. These processing variations when coupled with the variations introduced from the processing of the loop filter and the programming variations of the loop filter's frequency divider can cause a stable loop to become marginally stable or unstable. Typical VCO gain variations can reach as much as +/−50% due to these variations.

In FIG. 2, there is shown a prior art VCO 200 whose gain varies with the integrated circuit processing, mostly with the strength of the n-channel processing. The NOR logic gate latches 204–210 are composed of pseudo-NMOS logic to control their threshold levels. The gain of the VCO 200 is predominately affected by the n-channel transistor M1 that is used to convert the control voltage to a control current, acting as a Voltage-to-Current (V/I converter) 202, and the speed of the pseudo-NMOS NOR logic gates 204–210. The gain response for VCO 200 is shown in FIG. 3 for the case of nominal (nom), strong, and weak processing scenarios.

In order to combat process variations in VCO's some prior art designs have relied on trimming techniques during the testing of the integrated circuit manufacturing. This solution however increases the test time and thus causes the manufacturing costs to increase. Another prior art technique used for minimizing the process variation problem is to add positive feedback to the VCO design; this however can present stability issues to the VCO design. Given the above discussion, a need exists in the art for a VCO whose gain remains substantially constant over process variations.

BRIEF DESCRIPTION OF THE DRAWINGS

The features of the present invention, which are believed to be novel, are set forth with particularity in the appended claims. The invention, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
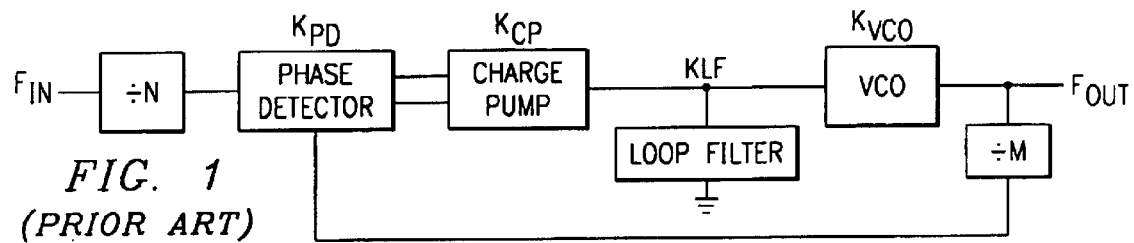
FIG. 1 shows a block diagram of a prior art Phase-locked loop.
Figure 2:
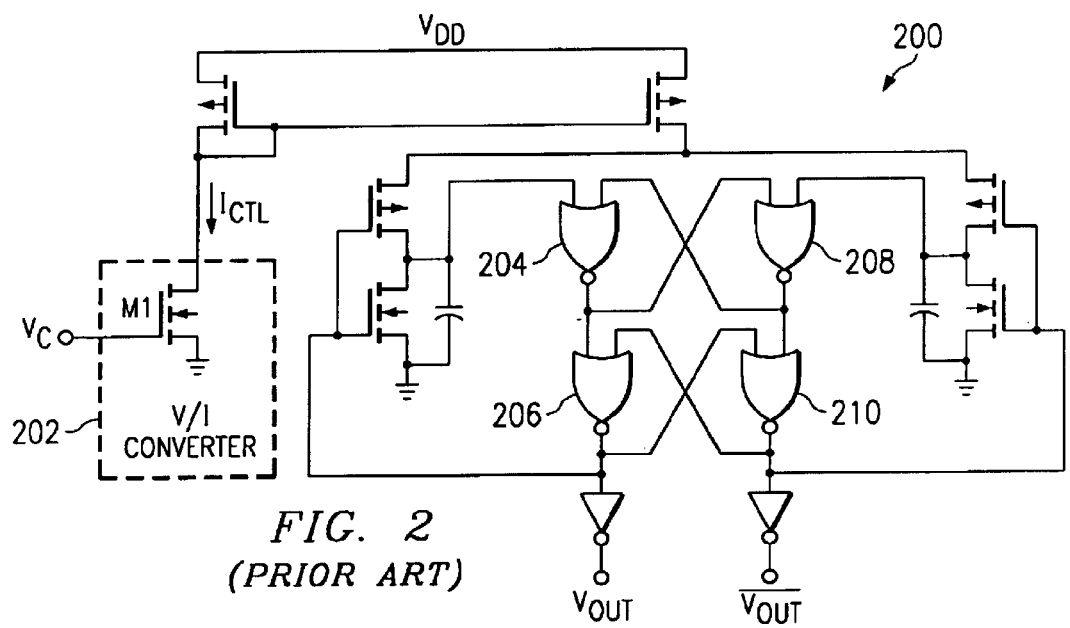
FIG. 2 shows a diagram of a prior art VCO.

While the specification concludes with claims defining the features of the invention that are regarded as novel, it is believed that the invention will be better understood from a consideration of the following description in conjunction with the drawing figures, in which like reference numerals are carried forward.

According to the present invention, the key to making the VCO gain substantially "process insensitive" is to make the voltage to current portion of the VCO inversely proportional to the processing (in this example the n-channel processing) in order to compensate for variations in the low-frequency portion of the VCO gain response. It should be noted that when referring to "low" or "high" frequency portions of the VCO gain response, they are relative terms and will depend on the particular VCO design, since the range of the VCO is dependent upon many things.

To compensate for high frequency variations, a number of differential transistor pairs are provided that have tail currents that are inversely proportional to the processing. One input of all the differential pairs is connected to the VCO's control voltage while the other inputs are connected to successively increasing voltages in the control voltage range. The output of each differential pair that is driven by the transistor whose input is connected to the control voltage is summed with the non-compensated control current. The other output of each differential pair is connected to the appropriate power supply. This design provides for higher values of control current as the control voltage increases, but since the additional current is inversely proportional to processing (e.g., n-channel processing), more current is added if the n-channel process is weak and less current is provided if the process is strong. The reference to strong and weak with regard to MOS processing in the preferred embodiment can be described as:

Strong: uCox/2 at +20%
Vt at −25%
Weak: uCox/2 at −20%
Vt at +25% where u is "mu", the mobility, Cox is the gate oxide capacitance and Vt is the threshold voltage. The nominal ("nom") processing threshold falls somewhere between the Strong and Weak thresholds mentioned above. Although these thresholds are used for the discussion in the preferred embodiment, one of ordinary skill in the art will understand that other variations and threshold levels can also be used in association with the present invention.

Figure 4:
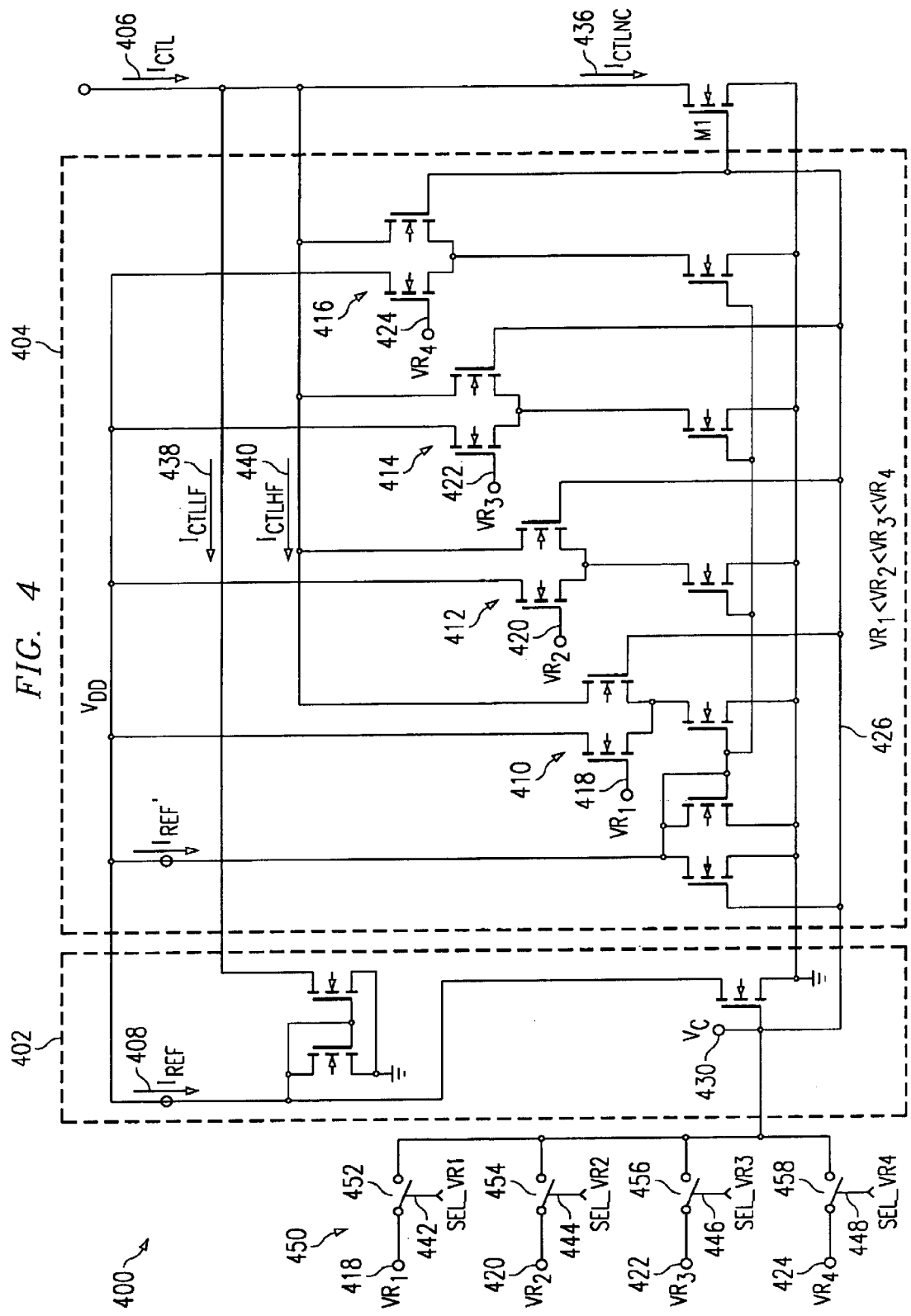
FIG. 4 shows a Voltage-to-Current (V/I) converter in accordance with the invention.

Referring now to FIG. 4, there is shown a Voltage to Current (V/I) Converter 400 for use with the VCO 200 and would replace V/I converter section 202. V/I converter 400 includes a low-frequency gain compensation section 402 and a high-frequency gain compensation section 404 in accordance with the invention. In the preferred embodiment, the low-frequency gain compensation section 402 of the present invention helps to compensate in the lower end of the control voltage range (e.g., below the $VR_1$ reference voltage level), while the high-frequency compensation section, aids when the control voltage is at or above the $VR_1$ voltage level, assuming $VR_1$ is the lowest of the reference voltages. The key to making the VCO's gain substantially process independent is to have the control current ($I_{CTL}$) 406 become inversely proportional to the n-channel processing. This can be partially accomplished by subtracting a version of $I_{CTL}$ 406 from a reference current ($I_{REF}$) 408. This gives the control current a component that is inversely proportional to the n-channel processing, $I_{CTLLF}$ 438, and tends to make the lower frequency portion of the VCO's gain response more consistent (e.g., has less fluctuations) over semiconductor processing variations.

The Voltage-to-Current (V/I) converter section that converts the control voltage ($V_C$) 430 to $I_{CTL}$ 406 can be modified as shown in FIG. 4 to add a component current to $I_{CTL}$ that is inversely proportional to the n-channel processing. The value of $I_{REF}$ 408 can be set to be just larger than the highest value of $I_{CTL}$, which occurs under strong NMOS processing for the highest values of $V_C$ 430.

To handle the higher frequency portion of the VCO gain response, a plurality of differential pairs 410–416 are setup in the high-frequency gain compensation section 404 with tail currents that are inversely proportional to the n-channel processing. One input 426, common to all the differential pairs 410–416 is coupled to the $V_C$ 430, while each of the second inputs of each one of the differential pairs 410–416 is connected to successively increasing voltages $VR_1<VR_2<VR_3<VR_4$ 418–424 in the $V_C$ control range. These successively increasing voltages can be provided using a series resistor ladder as one example. Note that although four differential pairs are used in the preferred embodiment, different number of differential pairs and associated second input voltages can be used in other designs.

As the $V_C$ 430 increases, more current that is inversely proportional to the n-channel processing is diverted to the high frequency control current ($I_{CTLHF}$) 440. The current $I_{CTLHF}$ 440 is summed with the non-compensated control current $I_{CTLNC}$ 436. This gives higher values of $I_{CTL}$ 406 as the $V_C$ increases, but since the additional current is inversely proportional to the n-channel processing, more current is added if the n-channel processing is weak, and less current is provided if the processing is strong.

Figure 5:
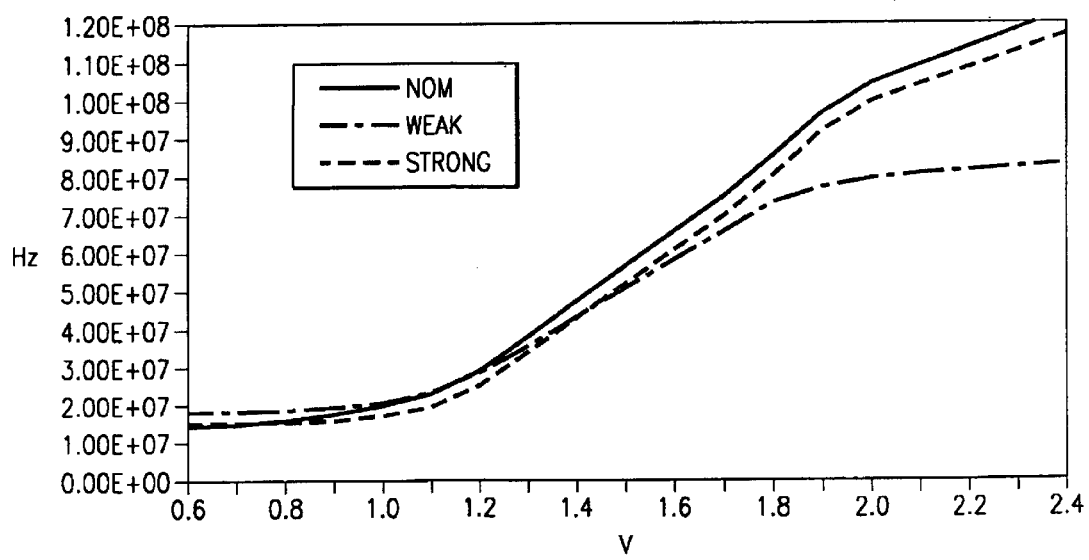
FIG. 5 shows a graph highlighting the PLL VCO gain response of the VCO of FIG. 4.

The reference voltages $VR_1$ 418, $VR_2$ 420, $VR_3$ 422, and VR4 424 are preferably designed so that the linear range of the successive differential pairs overlap. To accomplish this, in the preferred embodiment, $VR_2$ 420 is set a few 100 millivolts greater than $VR_1$ 418, while $VR_3$ 422 is set a few 100 millivolts greater than $VR_2$ 420, and so forth. Combining the low frequency gain compensation section 402, with the high frequency gain compensation section 404, helps compensate for processing variation effects on both the low and high frequency portions of the VCO's gain response. The compensated gain response over nominal, strong and weak case processing is shown in FIG. 5.

Most PLLs today are completely integrated where there is no access to any of the inputs/outputs of the blocks of FIG. 1 except for $F_{IN}$ and $F_{OUT}$. This hinders testability, particularly in testing the gain of the VCO since there is no way to force the control voltage at the input to the VCO, $V_C$, and then measure the VCO's output frequency. The V/I converter 400 allows a method for forcing the control voltage to the discrete voltages used for the high frequency gain compensation, $VR_1$, $VR_2$, $VR_3$, and $VR_4$. These voltages can be coupled to the control voltage and the VCO frequency can be measured at $V_C=VR_1$, $V_C=VR_2$, $V_C=VR_3$, and $V_C=VR_4$.

V/I Converter 400 includes an optional switch matrix 450 that allows for VR1 418, $VR_2$ 420, $VR_3$ 422, and $VR_4$ 424 to be coupled to the control voltage input $V_C$ 430 in order to test the VCO gain. If signal SEL_VR1 442 is active, the switch 452 is closed and $VR_1$ 418 is coupled to $V_C$ 430. If signal SEL_VR2 444 is active, the switch 454 is closed and $VR_2$ 420 is coupled to $V_C$ 430, and so on. During normal VCO operation, all switch control signals 442–448 are inactive and all switches 452–458 are open. During VCO gain testing, each switch 452–458 is closed one at a time and the VCO frequency is measured during the switch closure.

Figure 6:
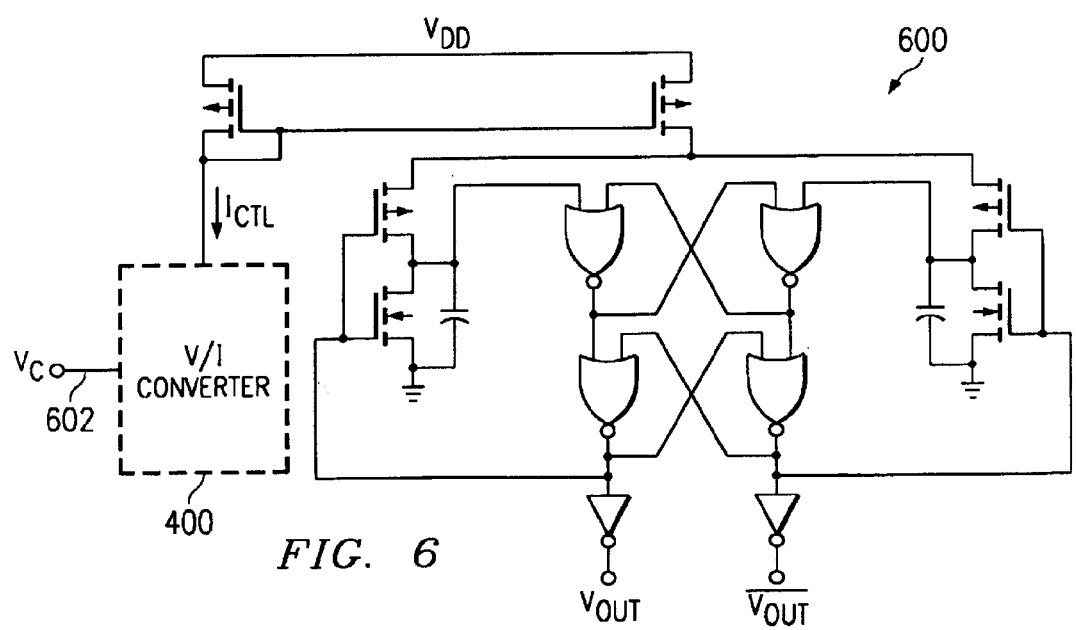
FIG. 6 shows a VCO in accordance with the invention.
Figure 3:
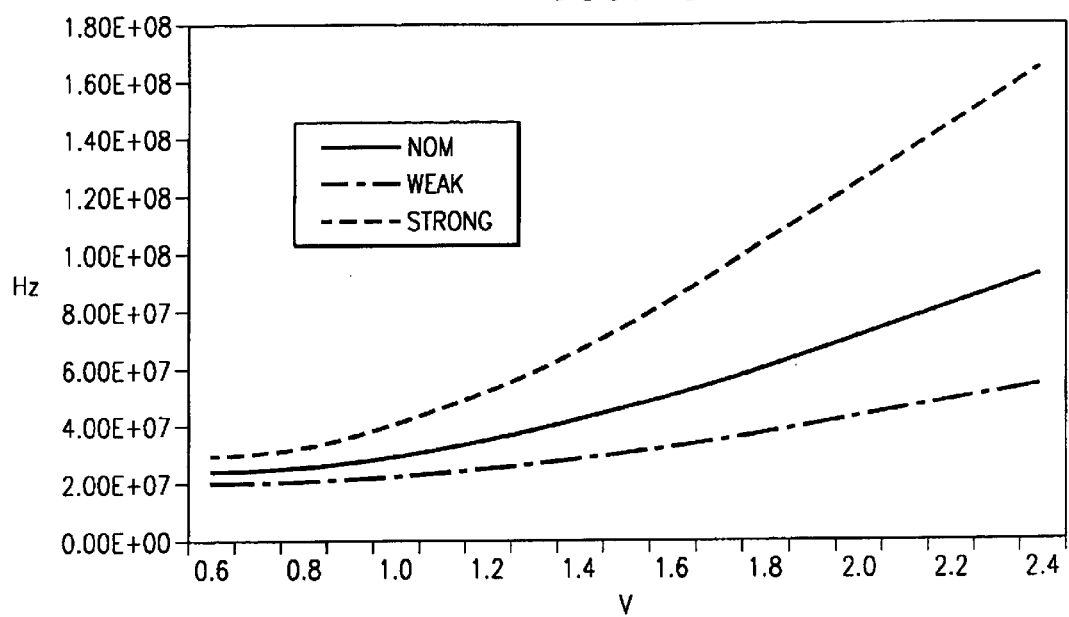
FIG. 3 shows a graph highlighting the PLL VCO gain response of the VCO of FIG. 2.

In FIG. 6, there is shown a VCO 600 that includes V/I converter 400 in order to provide for a process-insensitive, constant gain design that can be used to design predictable and stable PLLs. The VCO 600 of the present invention does not require trimming as found in some prior art designs which adds costly test time to the manufacture of the VCO. With the present invention, a much smaller control voltage range is required to be presented to the control voltage input 602 of V/I converter 400. This keeps the control voltage ($V_C$) from approaching the voltage supply rails when trying to produce a wide output frequency range over process variations, and allows for the VCO 600 to have an extended frequency range.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A voltage controlled oscillator (VCO) providing improved gain response over semiconductor process variations, comprising:

an input port for receiving a control voltage ($V_C$); and
a voltage-to-current (V/I) converter responsive to the control voltage and providing a control current, the V/I converter including:
a plurality of differential transistor pairs having tail currents that are inversely proportional to the semiconductor process variations that cause fluctuations in the VCO gain response; and
each of the plurality of differential transistor pairs each having a first input and a second input, the first input of each of said differential pairs coupled to the control voltage, the second input of each of the plurality of differential transistor pairs being coupled to one of successively increasing voltage levels.

2. A VCO as defined in claim 1, wherein the successively increasing voltage levels provided to the second inputs of the plurality of differential transistor pairs are chosen such that the linear range of the plurality of differential transistor pairs overlap.

3. A voltage controlled oscillator (VCO) providing improved gain response over semiconductor process variations, comprising:

an input port for receiving a control voltage ($V_C$); and
a voltage-to-current (V/I) converter responsive to the control voltage and providing a control current, the V/I converter including:
a plurality of differential transistor pairs; and
each of the plurality of differential transistor pairs each having a first input and a second input, the first input of each of said differential pairs coupled to the control voltage, the second input of each of the plurality of differential transistor pairs being coupled to one of successively increasing voltage levels;
wherein the V/I converter further comprises a low frequency gain compensation section coupled to the control voltage.

4. A VCO as defined in claim 3, wherein the low frequency gain compensation section compensates the control current with a current component that is inversely proportional to semiconductor processing variations that cause fluctuations in the VCO's low frequency gain response.

5. A voltage controlled oscillator (VCO) providing improved gain response over semiconductor process variations, comprising:

an input port for receiving a control voltage ($V_C$); and a voltage-to-current (V/I) converter responsive to the control voltage and providing a control current, the V/I converter including:

a plurality of differential transistor pairs; and each of the plurality of differential transistor pairs each having a first input and a second input, the first input of each of said differential pairs coupled to the control voltage, the second input of each of the plurality of differential transistor pairs being coupled to one of successively increasing voltage levels;

further comprising:

a transistor responsive to the control voltage; and the plurality of differential pairs comprise a high frequency gain compensation section for providing compensation to the control current in order to reduce fluctuations in the VCO's high frequency gain response.

6. A VCO as defined in claim 5, wherein each of the plurality of differential transistor pairs has an output coupled to the transistor.

7. A VCO as defined in claim 6, wherein a high frequency control current outputted by the plurality of differential transistor pairs is summed with the non-compensated control current.

8. A VCO as defined in claim 1, further comprising a low frequency gain compensation circuit coupled to the transistor for providing compensation to the control current in order to reduce fluctuations in the VCO's low frequency gain response.

9. A voltage controlled oscillator (VCO) providing improved gain response over semiconductor process variations, comprising:

an input port for receiving a control voltage ($V_C$); and a voltage-to-current (V/I) converter responsive to the control voltage and providing a control current, the V/I converter including:

a plurality of differential transistor pairs; and each of the plurality of differential transistor pairs each having a first input and a second input, the first input of each of said differential pairs coupled to the control voltage, the second input of each of the plurality of differential transistor pairs being coupled to one of successively increasing voltage levels;

further comprising a switch matrix coupled to the control voltage input port, the switch matrix allowing for the presentation of one of the successively increasing voltage levels to the control voltage input port in order to test the VCO.

10. A VCO having a high and low frequency gain response, the VCO comprising:

a transistor for converting a control voltage into a control current;

a low frequency gain compensation section coupled to the transistor, the low frequency gain compensation section gives the control current a component that is inversely proportional to semiconductor process variations that cause fluctuations in the VCO's low frequency gain response; and a high frequency gain compensation section coupled to the low frequency gain compensation section.

11. A VCO as defined in claim 10, wherein the high frequency gain compensation section includes a plurality of differential transistor pairs; and each of the plurality of differential transistor pairs each having one input coupled to the control voltage, and each of the plurality of differential transistor pairs each having a second input, with the second input of each of the plurality of differential transistor pairs being coupled to successively increasing voltage levels.

12. A VCO as defined in claim 11, wherein the plurality of differential transistor pairs have tail currents that are inversely proportional to semiconductor process variations that cause fluctuations in the VCO gain response.

13. A VCO as defined in claim 11, wherein the successively increasing voltage levels provided to the second inputs of the plurality of differential transistor pairs are chosen such that the linear range of the plurality of differential transistor pairs overlap.

14. A VCO as defined in claim 10, wherein the high frequency gain compensation section causes more control current being provided if the semiconductor process variations that cause fluctuations in the VCO high frequency gain response is weak and less control current being provided if the semiconductor process variations are strong.

15. A VCO as defined in claim 14, wherein each of the plurality of differential transistor pairs has an output coupled to the non-compensated control current.

16. A VCO as defined in claim 15, wherein a high frequency control current outputted by the plurality of differential transistor pairs is summed with the non-compensated control current.

17. A VCO as defined in claim 10, further comprising:

an input port coupled to the transistor for receiving the control voltage; and a switch matrix coupled to the control voltage input port, the switch matrix allowing for the presentation of one of the successively increasing voltage levels to the control voltage input port in order to test the VCO.

18. A voltage-to-current (V/I) converter responsive to a control voltage and providing a control current, the V/I converter comprising:

a plurality of differential transistor pairs, each of the plurality of differential transistor pairs each having:

a first input and a second input;

the first input of each of said differential pairs coupled to the control voltage; and a source of continually increasing voltage levels;

the second input of each of the plurality of differential transistor pairs being coupled to one of successively increasing voltage levels;

wherein the plurality of differential transistor pairs have tail currents that are inversely proportional to the semiconductor process variations that cause fluctuations in the VCO gain response.

19. A converter as defined in claim 18, wherein the successively increasing voltage levels provided to the second inputs of the plurality of differential transistor pairs are chosen such that the linear range of the plurality of differential transistor pairs overlap.

20. A voltage-to-current (V/I) converter responsive to a control voltage and providing a control current, the V/I converter comprising:
- a plurality of differential transistor pairs, each of the plurality of differential transistor pairs each having:
  - a first input and a second input;
  - the first input of each of said differential pairs coupled to the control voltage; and
- a source of continually increasing voltage levels;
- the second input of each of the plurality of differential transistor pairs being coupled to one of successively increasing voltage levels;
- wherein the V/I converter further comprises a low frequency gain compensation section coupled to the control voltage.

* * * * *